US008586873B2

(12) United States Patent  (10) Patent No.: US 8,586,873 B2
Wu  (45) Date of Patent: Nov. 19, 2013

(54) TEST POINT DESIGN FOR A HIGH SPEED BUS

(75) Inventor: Leon Wu, Taipei (TW)

(73) Assignee: Flextronics AP, LLC, Broomfield, CO (US)

( * ) Notice: Subject to any disclaimer, the term of this patent is extended or adjusted under 35 U.S.C. 154(b) by 269 days.

(21) Appl. No.: 12/710,622

(22) Filed: Feb. 23, 2010

(65) Prior Publication Data

US 2011/0203840 A1 Aug. 25, 2011

(51) Int. Cl.
 *H05K 1/11* (2006.01)
(52) U.S. Cl.
 USPC .......... 174/261; 174/255; 174/262; 174/264; 361/736; 361/780; 361/792; 361/794; 333/4; 333/34; 333/156
(58) Field of Classification Search
 USPC .......... 174/261, 255, 262, 264; 361/736, 780, 361/792, 794; 333/4, 34, 156
 See application file for complete search history.

(56) References Cited

U.S. PATENT DOCUMENTS

| | | | |
|---|---|---|---|
| 4,051,425 A | 9/1977 | Smith | |
| 4,490,690 A | * 12/1984 | Suzuki | 333/1 |
| 4,642,588 A | * 2/1987 | Kameya | 333/139 |
| 4,686,495 A | * 8/1987 | Kameya | 333/156 |
| 4,695,812 A | * 9/1987 | Kameya | 333/156 |
| 4,712,160 A | 12/1987 | Sato et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |
| 4,975,821 A | 12/1990 | Lethellier | |
| 5,038,264 A | 8/1991 | Steigerwald | |
| 5,101,322 A | 3/1992 | Ghaem et al. | |
| 5,164,657 A | 11/1992 | Gulczynski | |
| 5,235,491 A | 8/1993 | Weiss | |
| 5,262,932 A | 11/1993 | Stanley et al. | |
| 5,295,044 A | 3/1994 | Araki et al. | |
| 5,438,294 A | 8/1995 | Smith | |
| 5,490,052 A | 2/1996 | Yoshida et al. | |
| 5,565,761 A | 10/1996 | Hwang | |
| 5,565,781 A | 10/1996 | Dauge | |

(Continued)

OTHER PUBLICATIONS

EE Times.com—"Team Claims Midrange Wireless Energy Transfer", by R. Colin Johnson, 4 pages, Nov. 20, 2006.

(Continued)

*Primary Examiner* — Xiaoliang Chen
(74) *Attorney, Agent, or Firm* — Haverstock & Owens LLP

(57) ABSTRACT

A circuit board includes a pair of differential signal lines and a pair of test point pads, one test point pad coupled to one of the signal lines and another of the test point pads coupled to another of the signal lines. The two test point pads are staggered relative to each other and the two signal lines. The circuit board includes a plurality of conductive layers and a plurality of insulating layers. The conductive layers can be etched into conductive patterns, or traces, for connecting the electronic components, which are soldered to the circuit board. The conductive layers may be selectively connected together by vias. One or more of the conductive layers may be a metal plane for providing a ground plane and/or a power plane. To minimize or eliminate the capacitance generated between the test point pad and an underlying ground plane and/or power plane, portions of the ground plane and/or the portion of the power plane directly aligned with each test point pad are removed.

11 Claims, 6 Drawing Sheets

(56) References Cited

U.S. PATENT DOCUMENTS

| | | | |
|---|---|---|---|
| 5,592,128 A | 1/1997 | Hwang | |
| 5,673,185 A | 9/1997 | Albach et al. | |
| 5,712,772 A | 1/1998 | Telefus et al. | |
| 5,742,151 A | 4/1998 | Hwang | |
| 5,747,977 A | 5/1998 | Hwang | |
| 5,786,687 A | 7/1998 | Faulk | |
| 5,798,635 A | 8/1998 | Hwang et al. | |
| 5,804,950 A | 9/1998 | Hwang et al. | |
| 5,811,895 A | 9/1998 | Suzuki et al. | |
| 5,818,207 A | 10/1998 | Hwang | |
| 5,870,294 A | 2/1999 | Cyr | |
| 5,894,243 A | 4/1999 | Hwang | |
| 5,903,138 A | 5/1999 | Hwang et al. | |
| 5,905,369 A | 5/1999 | Ishii et al. | |
| 5,920,466 A | 7/1999 | Hirahara | |
| 5,923,543 A | 7/1999 | Choi | |
| 6,058,026 A | 5/2000 | Rozman | |
| 6,069,803 A | 5/2000 | Cross | |
| 6,091,233 A | 7/2000 | Hwang et al. | |
| 6,160,725 A | 12/2000 | Jansen | |
| 6,272,015 B1 | 8/2001 | Mangtani | |
| 6,282,092 B1 | 8/2001 | Okamoto et al. | |
| 6,341,075 B2 | 1/2002 | Yasumura | |
| 6,344,980 B1 | 2/2002 | Hwang et al. | |
| 6,366,483 B1 | 4/2002 | Ma et al. | |
| 6,396,277 B1 | 5/2002 | Fong et al. | |
| 6,407,514 B1 | 6/2002 | Glaser et al. | |
| 6,469,914 B1 | 10/2002 | Hwang et al. | |
| 6,469,980 B1 | 10/2002 | Takemura et al. | |
| 6,483,281 B2 | 11/2002 | Hwang | |
| 6,531,854 B2 | 3/2003 | Hwang | |
| 6,541,944 B2 | 4/2003 | Hwang | |
| 6,578,253 B1 | 6/2003 | Herbert | |
| 6,605,930 B2 | 8/2003 | Hwang | |
| 6,624,729 B2* | 9/2003 | Wright et al. | 333/238 |
| 6,657,417 B1 | 12/2003 | Hwang | |
| 6,671,189 B2 | 12/2003 | Jansen et al. | |
| 6,674,272 B2 | 1/2004 | Hwang | |
| 6,831,846 B2 | 12/2004 | Yasumura | |
| 6,958,920 B2 | 10/2005 | Mednik et al. | |
| 7,038,406 B2 | 5/2006 | Wilson | |
| 7,047,059 B2 | 5/2006 | Avrin et al. | |
| 7,167,384 B2 | 1/2007 | Yasumura | |
| 7,286,374 B2 | 10/2007 | Yasumura | |
| 7,286,376 B2 | 10/2007 | Yang | |
| 7,301,785 B2 | 11/2007 | Yasumura | |
| 7,339,801 B2 | 3/2008 | Yasumura | |
| 7,388,762 B2 | 6/2008 | Yasumura | |
| 7,423,887 B2 | 9/2008 | Yasumura | |
| 7,583,513 B2* | 9/2009 | Boggs et al. | 361/792 |
| 7,639,520 B1 | 12/2009 | Zansky et al. | |
| 2002/0011823 A1 | 1/2002 | Lee | |
| 2003/0035303 A1 | 2/2003 | Balakrishnan et al. | |
| 2004/0016117 A1* | 1/2004 | Wyrzykowska et al. | 29/852 |
| 2004/0037050 A1* | 2/2004 | Nakayama et al. | 361/736 |
| 2004/0040744 A1* | 3/2004 | Wyrzykowska et al. | 174/262 |
| 2004/0066662 A1 | 4/2004 | Park | |
| 2004/0072467 A1* | 4/2004 | Jordan et al. | 439/492 |
| 2004/0150970 A1* | 8/2004 | Lee | 361/794 |
| 2004/0228153 A1 | 11/2004 | Cao et al. | |
| 2005/0029013 A1* | 2/2005 | Lee | 174/262 |
| 2005/0041976 A1* | 2/2005 | Sun et al. | 398/92 |
| 2005/0063166 A1* | 3/2005 | Boggs et al. | 361/780 |
| 2005/0105224 A1 | 5/2005 | Nishi | |
| 2005/0281425 A1 | 12/2005 | Greuet et al. | |
| 2006/0176719 A1 | 8/2006 | Uruno et al. | |
| 2006/0284697 A1* | 12/2006 | Lin et al. | 333/4 |
| 2007/0007933 A1 | 1/2007 | Chan et al. | |
| 2007/0192559 A1* | 8/2007 | Betsui et al. | 711/167 |
| 2007/0236967 A1 | 10/2007 | Liu et al. | |
| 2008/0245556 A1* | 10/2008 | Bird et al. | 174/262 |
| 2008/0245557 A1* | 10/2008 | Bird et al. | 174/262 |
| 2008/0250373 A1* | 10/2008 | Bird et al. | 716/7 |
| 2008/0250377 A1* | 10/2008 | Bird et al. | 716/15 |
| 2009/0014206 A1* | 1/2009 | Motohashi et al. | 174/262 |
| 2009/0015345 A1* | 1/2009 | Kushta et al. | 333/34 |
| 2009/0045889 A1* | 2/2009 | Goergen et al. | 333/175 |
| 2009/0224785 A1* | 9/2009 | Breinlinger et al. | 324/755 |
| 2009/0231887 A1 | 9/2009 | Ye et al. | |
| 2009/0290384 A1 | 11/2009 | Jungreis | |
| 2009/0290385 A1 | 11/2009 | Jungreis et al. | |

OTHER PUBLICATIONS

EE Times.com—"Wireless Beacon Could Recharge Consumer Devices", by R. Colin Johnson, 3 pages, Jan. 11, 2007.

Hang-Seok Choi et al., "Novel Zero-Voltage and Zero-Current-Switching (ZVZCS) Full-Bridge PWM Converter Using Coupled Output Inductor", Sep. 2002 IEEE, pp. 641-648.

"New Architectures for Radio-Frequency dc/dc Power Conversion", Juan Rivas et al., Laboratory for Electromagnetic and Electronic Systems, Massachusetts Institute of Technology, Room 10-171 Cambridge, MA 02139, pp. 4074-4084, Jan. 2004.

Scollo, P. Fichera R., "Electronic Transformer for a 12V Halogen Lamp", Jan. 1999, ST Microelectronics pp. 1-4.

"An Automatic Line Voltage Switching Circuit", SGS-Thomson Microelectronics, Application Note, by Vajapeyam Sukumar and Thierry Castagnet, 6 pages, copyright 1995-SGS-Thomson Microelectronics, printed in Italy.

"Test Fixturing", Bead Probe Handbook, Successfully Implementing Agilent Medalist Bead Probes in Practice, copyright Agilent Technologies, Inc., 2007, pp. 81-96.

\* cited by examiner

TEST POINT DESIGN FOR A HIGH SPEED BUS

FIELD OF THE INVENTION

The present invention relates to signal lines on a printed circuit board. More particularly, the present invention relates to a test point design for a high speed bus.

BACKGROUND

Electrical signals are communicated between various electronic components, such as integrated circuits, resistors, capacitors, etc., using metal traces on a circuit board, such as a printed circuit board (PCB). Circuit boards are configured to connect the electronic components in a desired pattern to form an electrical circuit, collectively referred to as printed circuit assemblies (PCAs). A circuit board typically includes one or more conductive layers separated by layers of insulating material, referred to as substrates or dielectrics. The conductive layers are etched into conductive patterns, or traces, for connecting the electronic components, which are soldered to the circuit board. The conductive layers may be selectively connected together by vias. One or more of the conductive layers may be of solid metal for providing a ground plane and/or a power plane. An outer layer of the circuit board typically includes pads and lands to which the electronic components are soldered. Most circuit boards also include a solder mask layer, which is typically a plastic polymer. The solder mask covers areas of the circuit board that should not be soldered and includes cutouts or openings in regions where the electronic components are to be soldered to the circuit board. The solder mask, which is typically a plastic polymer, resists wetting by solder, prevents solder from bridging between conductors and creating short circuits, and may also provide protection against environmental contaminants.

FIG. 1 illustrates a cut-out side view of an exemplary circuit board. The circuit board includes multiple layers 28-60, including dielectric layers 30, 34, 38, 42, 46, 50, 34, and 58, ground planes 32, 40, 44, 48, and 56, and power planes 36 and 52. The circuit board also includes a bottom layer 60 and a top layer 28. A pair of signal lines 2 and 4, and test point pads 6 and 8 are configured on the top layer 28. It is understood that electronic components and additional signal lines can be configured on the top layer 28. Although not shown in FIG. 1, it is understood that a solder mask can be added as part of the top layer 28. It is understood that more or less than the number of dielectric layers, ground plane layers, and power plane layers can be included in the circuit board. It is also understood that additional conductive layers can be added and selectively etched to provide conductive patterns within the circuit board and between the various electronic components and signal lines on the top layer 28.

Printed circuit assemblies (PCA's) are typically tested after manufacture to verify the continuity of traces between pads and vias on the circuit board and to verify that electronic components loaded on the circuit board perform within specifications. Circuit board testing is performed by applying electrical signals to certain contact points, referred to as test point pads, on the circuit board. A circuit board test device, such as an automated in-circuit test (ICT), is capable of probing conductive pads, vias, and traces on the circuit board under test. The circuit board test device typically includes a test probe unit having multiple test probes, each test probe capable of contacting a certain test point pad of the circuit board and applying an electrical signal to the test point pad. This necessitates having test points within the layout of circuit boards that are accessible by the test probes. Test point pads are usually circular targets with a 25 to 35 millimeter diameter that are connected to traces on the circuit board. In some cases, these test points are deliberately added test point pads, and in other cases the test points are pads surrounding vias already provided in the circuit board.

Layout rules typically require test point pads to be at least a minimum distance apart and may require the diameter of the test point pads to greatly exceed the width of the traces. For example, due to a width of the test probes, when two separate probes simultaneously engage two adjacent test point pads, a minimum distance between the adjacent test point pads is required to provide sufficient physical space for access by the two separate probes. This minimum distance is often measured from a center of each of the two adjacent test point pads, and is referred to as pitch. In many applications, the minimum pitch is about 65 millimeters.

In many applications, high-speed data is transmitted through a pair of differential transmission signal lines, or traces. The pair of signal lines are configured close together, often too close to enable complimentary test point pads to be connected to the signal lines because the minimum pitch between the two test point pads can not be established.

FIG. 2 illustrates a top-down view of a pair of differential transmission signal lines and corresponding test point pads according to a conventional configuration. The pair of differential signal lines includes a first signal line 2 and a second signal line 4. A first test point pad 6 is used to test the first signal line 2, and a second test point pad 8 is used to test the second signal line 4. Due to the physical parameters of conventional test probes, the first test point pad 6 and the second test point pad 8 must be spaced a minimum distance apart from each other in order to permit a first test probe to contact the first test point pad 6 while a second test probe contacts the second test point pad 8. This minimum distance is defined as pitch, and is shown as line 14 having a distance measured from a center of the first test point pad 6 to a center of the second test point pad 8. As shown in FIG. 2, line 14 is perpendicular to the signal lines 2 and 4, and as such the two test point pads 6 and 8 are said to be aligned. In this configuration, the pitch 14 is great enough to prevent the test point pads 6 and 8 from being connected directly to the signal lines 2 and 4, respectively. Moving the test point pads 6 and 8 to connect directly to the signal lines 2 and 4 would prohibit two test probes from simultaneously accessing the test point pads 6 and 8. As such, the test point pad 6 is offset from the signal line 2 and the test point pad 8 is offset from the signal line 4, thereby providing the minimum pitch 14. As the test point pads 6 and 8 are no longer connected directly to the signal lines 2 and 4, the test point pads 6 and 8 must be indirectly connected. An extension, or bridge, 10 is coupled to the test point pad 6. A via (not shown) couples the bridge 10 to a lower layer trace (not shown) that is coupled to the signal line 2. Similarly, an extension, or bridge, 12 is coupled to the test point pad 8. A via (not shown) couples the bridge 10 to a lower layer trace (not shown) that is coupled to the signal line 4.

In operation, an electrical signal transmitted along signal line 2 is divided into two signals at the test point pad 6. A first of the signals is transmitted to the test point pad 6 and the second signal continues along the signal line 2. When a test probe is contacted to the test point pad 6, the first electrical signal is transmitted to the test probe. However, when a test probe is not contacted to the test point pad 6, this signal path is considered "open" and the first electrical signal is reflected back to the signal line 2. As such, the structure including the test point pad 6 and the signal line 2 is referred to as an "open stub". The open stub effects the impedance of the signal line 2 at the test point pad 6, and also effects the signal quality of the electrical signal transmitted along the signal line 2. The effect of the open stub is measured by the physical size of the test point pad 2. The larger the open stub, the greater the change of impedance of the signal line 2 at the test point pad 6, and the greater the decrease in signal quality of the electrical signal transmitted along the signal line 2. A similar open stub is formed by the test point pad 8.

FIG. 3A illustrates a top-down view of a pair of differential transmission signal lines and corresponding test point pads according to an alternative conventional configuration. The configuration of FIG. 3A is similar to the configuration of FIG. 2 where the test point pads 6 and 8 are positioned with the minimum pitch 14, except that a connecting line 16 connects the test point pad 6 to the signal line 2, and a connecting line 18 connects the test point pad 8 to the signal line 4. The connecting lines 16 and 18 are on the same layer as the signal lines 2 and 4 and the test point pads 6 and 8. Using connecting lines on the same layer as the signal lines and the test point pads eliminates the need to couple the test point pads to the signal lines using an inner layer conductive pattern, such as in FIG. 1. However, the open stub structure is increased to include both the test point pad and the connecting line. As such the effect of the open stub is increased, which further changes the impedance of the signal line at the test point pad and further decreases the signal quality of the electrical signal transmitted along the signal line.

FIG. 3B illustrates a top-down view of a pair of differential transmission signal lines and corresponding test point pads according to another alternative conventional configuration. The configuration of FIG. 3B is similar to the configuration of FIG. 2 where the test point pads 6 and 8 are positioned with the minimum pitch 14, except that the signals lines 22 and 24 are altered to connect directly with the test point pads 6 and 8, respectively. Redirecting the signal lines 22 and 24 to enable direct connection with the test point pads 6 and 8, respectively, eliminates the need to couple the test point pads to the signal lines using an inner layer conductive pattern, such as in FIG. 1.

It is desired to control the transmission impedance value across the entire run of each signal line. There are a number of critical parameters that effect the impedance of the signal path. These parameters include the signal line width, the signal line separation with an adjacent signal line, the signal line thickness, and the dielectric constants of the solder mask and board materials. These parameters influence the inductance, capacitance, and resistance (skin effect and DC) of the signal lines which combine to determine the transmission impedance. The addition of a test point pad to a signal line negatively impacts the transmission impedance. A capacitance is formed between the test point pad and the ground planes and power planes positioned below the test point pad. Conceptually, the test point pad forms one of the conductors of a capacitor and the ground planes and power planes form the other conductor in the capacitor. This capacitance negatively impacts the signal quality of the electrical signal transmitted along the signal line connected to the test point pad.

SUMMARY OF THE INVENTION

A circuit board includes a pair of differential signal lines and a pair of test point pads, one test point pad coupled to one of the signal lines and another of the test point pads coupled to another of the signal lines. The two test point pads are staggered relative to each other and the two signal lines. The circuit board includes a plurality of conductive layers and a plurality of insulating layers. The conductive layers can be etched into conductive patterns, or traces, for connecting the electronic components, which are soldered to the circuit board. The conductive layers may be selectively connected together by vias. One or more of the conductive layers may be a metal plane for providing a ground plane and/or a power plane. To minimize or eliminate the capacitance generated between the test point pad and an underlying ground plane and/or power plane, portions of the ground plane and/or the portion of the power plane directly aligned with each test point pad are removed.

In one aspect, a test point design is disclosed. The test point design includes a circuit board comprising a plurality of layers including a power plane and a ground plane, the circuit board further comprises a differential pair of signal lines including a first signal line and a second signal line, and a pair of test point pads including a first test point pad connected to the first signal line and a second test point pad connected to the second signal line, wherein a first portion of the power plane and a first portion of the ground plane below the first test point pad are removed and a second portion of the power plane and a second portion of the ground plane below the second test point pad are removed. In some embodiments, first test point pad and the second test point pad are staggered relative to the pair of signal lines. The first test point pad and the second test point pad can be staggered such that a first perpendicular line between a center of the first test point pad and the first signal line is not aligned with a second perpendicular line between a center of the second test point pad and the second signal line. The pitch between the center of the first test point pad and the center of the second test point pad can be about 65 millimeters. In some embodiments, the pair of test point pads are staggered by a pitch sufficient to enable a first probe to contact the first test point pad and a second probe to contact the second test point pad concurrently. The differential signal lines are positioned adjacent to each other. A segment of the first signal line connected to the first test pad, a segment of the second signal line connected to the second test pad, the first test pad, and the second test pad can be all positioned in a same plane. The first test point pad and the second test point pad are both positioned on an outer layer of the circuit board. In some embodiments, the circuit board Includes a plurality of power planes, and the first portion and the second portion from one or more power planes nearest the first test point pad and the second test point pad are removed. In some embodiments, the circuit board includes a plurality of ground planes, and the first portion and the second portion from one or more ground planes nearest the first test point pad and the second test point pad are removed. In some embodiments, the circuit board includes a plurality of power planes and a plurality of ground planes, and the first portion and the second portion from one or more power planes and one or more ground planes nearest the first test point pad and the second test point pad are removed.

In another aspect, a method of configuring a test point design for a circuit board including a power plane and a ground plane is disclosed. The method Includes removing a first portion of the power plane from a first position on the power plane that is to be aligned with a first test point pad on an outer layer of the circuit board, removing a second portion of the power plane from a second position on the power plane that is to be aligned with a second test point pad on the outer layer of the circuit board, removing a first portion of the ground plane from a first position on the ground plane that is to be aligned with the first test point pad, wherein the first position on the ground plane is aligned with the first position on the power plane, removing a second portion of the ground plane from a second position on the ground plane that is to be aligned with the second test point pad, wherein the second position on the ground plane is aligned with the second position on the power plane, adding a pair of differential signal lines to the outer layer of the circuit board, wherein the pair of differential signal lines includes a first signal line and a second signal line, and adding the first test point pad and the second test point pad to the outer layer of the circuit board, wherein the first test point pad is connected to the first signal line and the second test point pad is connected to the second signal line. The method can also include staggering a position of the first test point pad and a position of the second test point pad relative to the pair of signal lines. The first test point pad and the second test point pad can be staggered such that a first perpendicular line between a center of the first test point pad and the first signal line is not aligned with a second perpendicular line between a center of the second test point pad and the second signal line. The pitch between the center of the first test point pad and the center of the second test point pad can be about 65 millimeters. The pair of test point pads can be staggered by a pitch sufficient to enable a first probe to contact the first test point pad and a second probe to contact the second test point pad concurrently. The differential signal lines are positioned adjacent to each other. A segment of the first signal line connected to the first test pad, a segment of the second signal line connected to the second test pad, the first test pad, and the second test pad can be all positioned in a same plane. In some embodiments, the circuit board includes a plurality of power planes, and the first portion and the second portion from one or more of the plurality of power planes nearest the outer layer are removed. In some embodiments, the circuit board includes a plurality of ground planes, and the first portion and the second portion from one or more of the plurality of ground planes nearest the outer layer are removed. In some embodiments, the circuit board includes a plurality of power planes and a plurality of ground planes, and the first portion and the second portion from one or more of the plurality of power planes and one or more of the plurality of ground planes nearest the outer layer are removed. The circuit board includes a plurality of layers including the power plane, the ground plane, and the outer layer. In some embodiments, each layer is formed using semiconductor processing techniques and the first portions and second portions of each of the power plane and the ground plane are removed by selective etching. In this case, the removed first portion and second portion of the power plane are filled by insulating material from an insulating layer deposited over the power plane, and the removed first portion and second portion of the ground plane are filled by insulating material from an insulating layer deposited over the ground plane. In some embodiments, the method also includes separately forming at least the power plane as part of a first layered structure and the ground plane as part of a second layered structure, coupling the first layered structure to the second layered structure to form a combined layer structure, cutting a first block and a second block from the combined layer structure, wherein a position of the first block corresponds to the first position on the ground plane and the first position on the power plane, and a position of the second block corresponds to the second position on the ground plane and the second position on the power plane, and coupling the outer layer to the combined layer structure so that the first test point pad is aligned with the first block and the second test point pad is aligned with the second block. In this embodiment, the pair of differential signal lines, the first test point pad, and the second test point pad can be formed on the outer layer prior to coupling the outer layer to the combined layer structure. Alternatively, the outer layer can be coupled to the combined layer structure prior to forming the pair of differential signal lines, the first test point pad, and the second test point pad on the outer layer, and once coupled to the combined layer structure, the pair of differential signal lines, the first test point pad, and the second test point pad are formed on the outer layer.

Other features and advantages of the test point design will become apparent after reviewing the detailed description of the embodiments set forth below.

BRIEF DESCRIPTION OF THE DRAWINGS

The accompanying drawings, which are incorporated in and form a part of this specification, illustrate embodiments of the test point design and, together with the description, serve to explain the principles of the test point design, but not limit the test point design to the disclosed examples.

The test point design is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Figure 1:
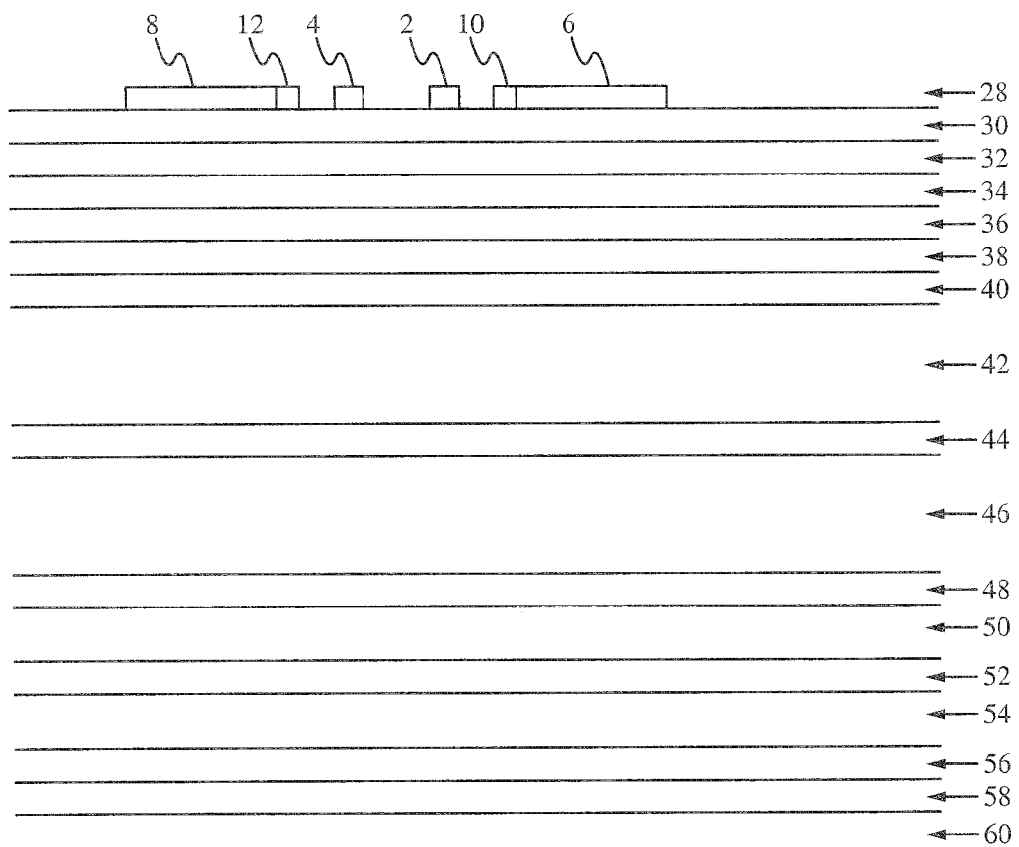
FIG. 1 illustrates an cut-out side view of an exemplary circuit board.

Reference will now be made in detail to the embodiments of the test point design, examples of which are illustrated in the accompanying drawings. While the test point design will be described in conjunction with the embodiments below, it will be understood that they are not intended to limit the test point design to these embodiments and examples. On the contrary, the test point design is intended to cover alternatives, modifications and equivalents, which may be included within the spirit and scope of the test point design as defined by the appended claims. Furthermore, in the following detailed description of the test point design, numerous specific details are set forth in order to more fully illustrate the test point design. However, it will be apparent to one of ordinary skill in the prior art that the test point design may be practiced without these specific details. In other instances, well-known methods and procedures, components and processes haven not been described in detail so as not to unnecessarily obscure aspects of the test point design. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the test point design are directed to a circuit board including a pair of differential signal lines, referred to individually as a first signal line and a second signal line, and a pair of test point pads, a first test point pad connected to the first signal line and a second test point pad connected to the second signal line. The positions of the two test point pads are staggered such that a line connected to the center of the first test point pad and the center of the second test point pad is not perpendicular to the two signal lines. The two test point pads are also positioned at a minimum pitch sufficient to allow two test probes to access the two test point pads simultaneously. In this manner, the each test point pad is connected directly to one of the signal lines while maintaining the minimum pitch.

The circuit board includes a plurality of conductive layers and a plurality of insulating layers. The conductive layers can be etched into conductive patterns, or traces, for connecting the electronic components, which are soldered to the circuit board. The conductive layers may be selectively connected together by vias. One or more of the conductive layers may be a metal plane for providing a ground plane and/or a power plane. In some embodiments, the pair of differential signal lines and the corresponding test point pads are formed on a top layer of the circuit board. A solder mask can be formed over the top layer, with openings in the solder mask at each of the test point pads. In other embodiments, the pair of differential signal lines and the corresponding test points pads are formed on a bottom layer of the circuit board. In still other embodiments, the pair of differential signal lines are formed on an inner conductive layer or layers of the circuit board, and the signal lines are routed from the inner layer(s) to an outer layer, such as the top layer or the bottom layer, where each signal line is connected to a corresponding test point pad. As such, at least a portion of each signal line is formed on an outer layer of the circuit board, where the portion of the signal line is connected to a test point pad.

To minimize or eliminate the capacitance generated between the test point pad and an underlying ground plane and/or power plane, the portion of the ground plane and/or the portion of the power plane directly aligned with the test point pad is removed. In the configuration where the test point pad is formed on a top layer of the circuit board, the portion of the ground plane and/or power plane that is directly underneath the test point pad is removed. In a configuration where the circuit board includes a plurality of ground planes, the portion from one or more of the ground planes nearest the test point pad is removed. In a configuration where the circuit board includes a plurality of power planes, the portion from one or more of the ground planes nearest the test point pad is removed. It is a design configuration to determine how many of the ground planes and/or power planes have a portion removed. The further away are the removal of conductive portions of the ground planes and/or power planes from the test point pad, the greater the reduction of the undesired capacitance generated by the test point pad. In some embodiments, the ground plane and the power plane closest to the test point pad have a portion removed. In general, any number of the conductive planes, ground plane(s) or power plane(s), closest to the test point pad can have a portion removed.

Figure 4:
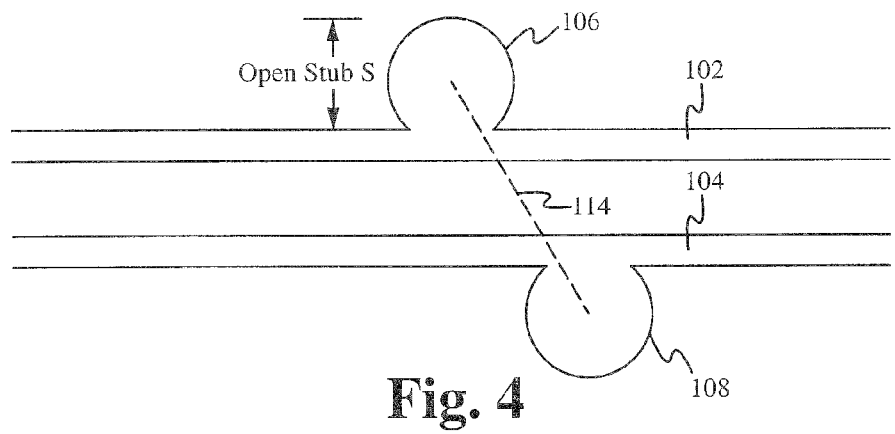
FIG. 4 illustrates a top-down view of a pair of differential transmission signal lines and corresponding test point pads positioned in a staggered configuration.

FIG. 4 illustrates a top-down view of a pair of differential transmission signal lines and corresponding test point pads positioned in a staggered configuration. The pair of differential signal lines includes a first signal line 102 and a second signal line 104. A first test point pad 106 is used to test the first signal line 102, and a second test point pad 108 is used to test the second signal line 104. The position of the first test point pad 106 and the position of the second test point pad 108 are staggered relative to the two signal lines 102, 104, that is the two test point pads 106, 108 are not aligned with each other relative to the two signal lines 106, 108. As shown in FIG. 4, a line connecting the center of the first test point pad 106 and the center of the second test point pad 108 is not perpendicular to the two signal lines 102, 104. The two test point pads 106, 108 are also positioned at a minimum pitch 114 sufficient to allow two test probes to access the two test point pads 106, 108 simultaneously. In this manner, each test point pad 106, 108 is connected directly to one of the signal lines 102, 104, respectively, while maintaining the minimum pitch 114. The two test point pads 106, 108 are staggered apart from each other by at least the minimum pitch 114 to permit a first test probe to contact the first test point pad 106 while a second test probe simultaneously contacts the second test point pad 108. In an exemplary application, the minimum pitch is approximately 65 millimeters. It is understood that the positions of the two test point pads 106, 108 can be staggered to accommodate a minimum pitch that is greater than or less than 65 millimeters.

Figure 2:
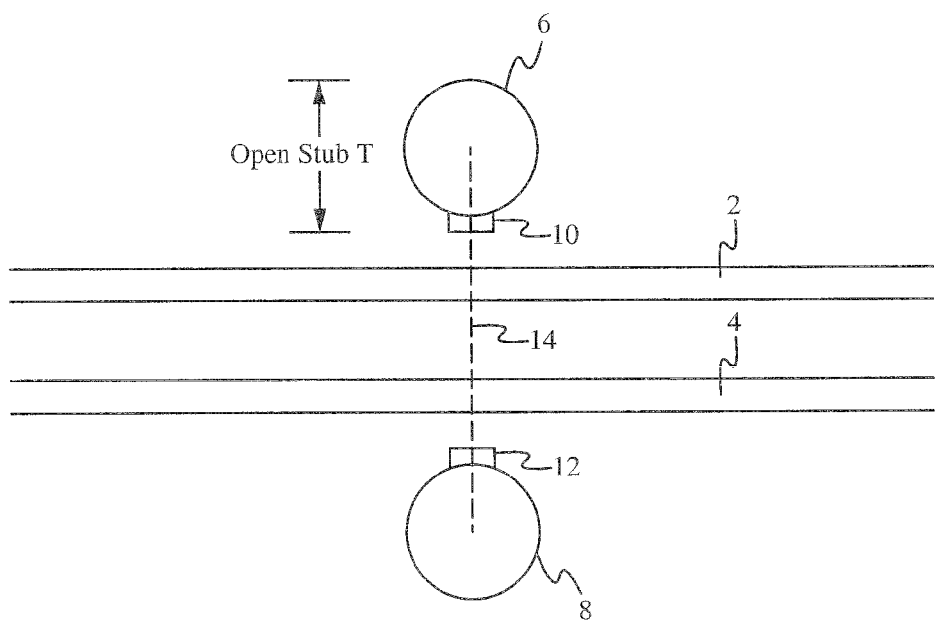
FIG. 2 illustrates a top-down view of a pair of differential transmission signal lines and corresponding test point pads according to a conventional configuration.
Figure 3A:
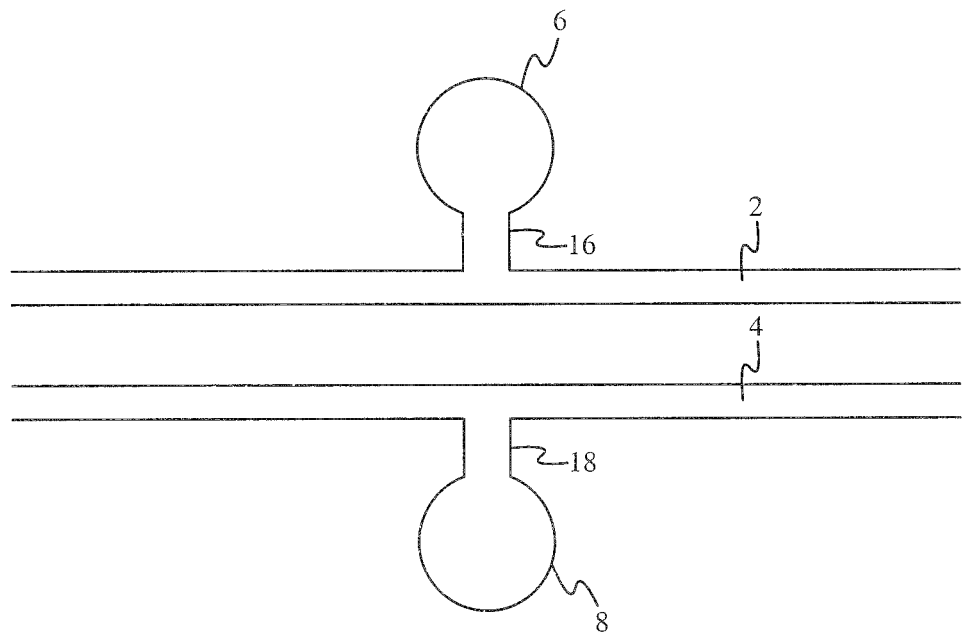
FIG. 3A illustrates a top-down view of a pair of differential transmission signal lines and corresponding test point pads according to an alternative conventional configuration.
Figure 3B:
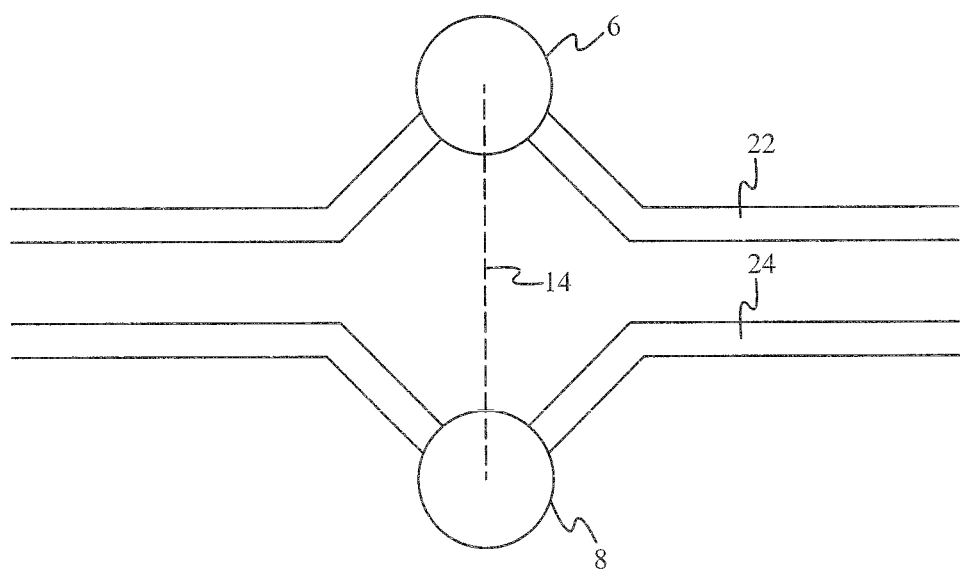
FIG. 3B illustrates a top-down view of a pair of differential transmission signal lines and corresponding test point pads according to another alternative conventional configuration.

Since the two test point pads 106, 108 are connected directly to the signal lines 102, 104, respectively, the physical size of the open stub S corresponding to each test point pad 106, 108 is reduced compared to the case where the test point pad is offset from the signal line, as in the conventional configuration of FIG. 2. In an exemplary configuration where the test point pad 106 has the same radius as the test point pad 6 (FIG. 2), the open stub S corresponding to the test point pad 106 is smaller than the open stub T (FIG. 2) corresponding to the test point pad 6. A smaller open stub value reduces the impedance effect of the test point pad, which results in a higher signal quality of an electrical signal passing through the signal line at the test point pad.

Figure 5:
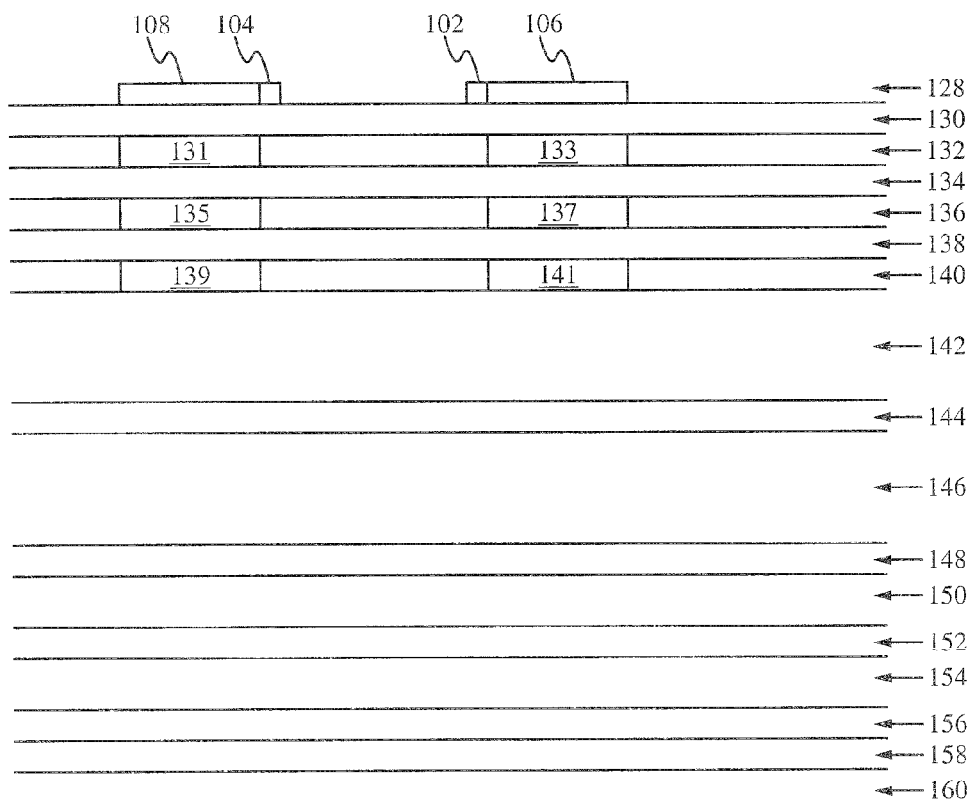
FIG. 5 illustrates an cut-out side view of an exemplary circuit board including the pair of differential signal lines and corresponding test point pads of FIG. 4.

FIG. 5 illustrates a cut-out side view of an exemplary circuit board including the pair of differential signal lines and corresponding test point pads of FIG. 4. The circuit board includes multiple layers including dielectric layers 130, 134, 138, 142, 146, 150, 154, and 158, ground planes 132, 140, 144, 148, and 156, and power planes 136 and 152. The circuit board also includes a bottom layer 160 and a top layer 128. The pair of signal lines 102 and 104, and test point pads 106 and 108 are configured on the top layer 128. It is understood that electronic components and additional signal lines can be configured on the top layer 128. Although not shown in FIG. 5, it is understood that a solder mask can be added on the top layer 128, with openings in the solder mask to allow test probe access to the test point pads 106 and 108. It is understood that more or less than the number of dielectric layers, ground plane layers, and power plane layers can be included in the circuit board. It is also understood that additional conductive layers can be added and selectively etched to provide conductive patterns within the circuit board, including the signal lines 102 and 104 on the top layer 28, and between the various electronic components coupled to the circuit board.

In addition to staggering the position of the two test point pads 106, 108, portions of one or more of the conductive planes nearest the test point pads are removed, or "cut", conceptually forming apertures, or holes, completely through a thickness of the conductive planes. Each removed portion of the conductive plane is that portion aligned, or "underneath" in the case where the test point pads 106, 108 are formed on the "top" layer 128, with the test point pad. As shown in FIG. 5, a portion 133 conceptually represents a removed portion of the ground plane 132 that is aligned with, or underneath, the test point pad 106. Similarly, a portion 131 represents a removed portion of the ground plane 132 that is aligned with the test point pad 108. Depending on the application and the desired adjustment of the capacitance effect caused by the test point pads, one or more conductive layers can have portions similarly removed. In the exemplary application of FIG. 5, two additional conductive layers, the power plane 136 and the ground plane 140, have portions removed. Specifically, a portion 137 represents a removed portion of the power plane 136 that is aligned with the test point pad 106, and a portion 135 represents a removed portion of the power plane 136 that is aligned with the test point pad 108. Also, a portion 141 represents a removed portion of the ground plane 140 that is aligned with the test point pad 106, and a portion 139 represents a removed portion of the ground plane 140 that is aligned with the test point pad 108. It is understood that portions can be removed from more or less than the three nearest conductive planes to the test point pads.

Figure 6:
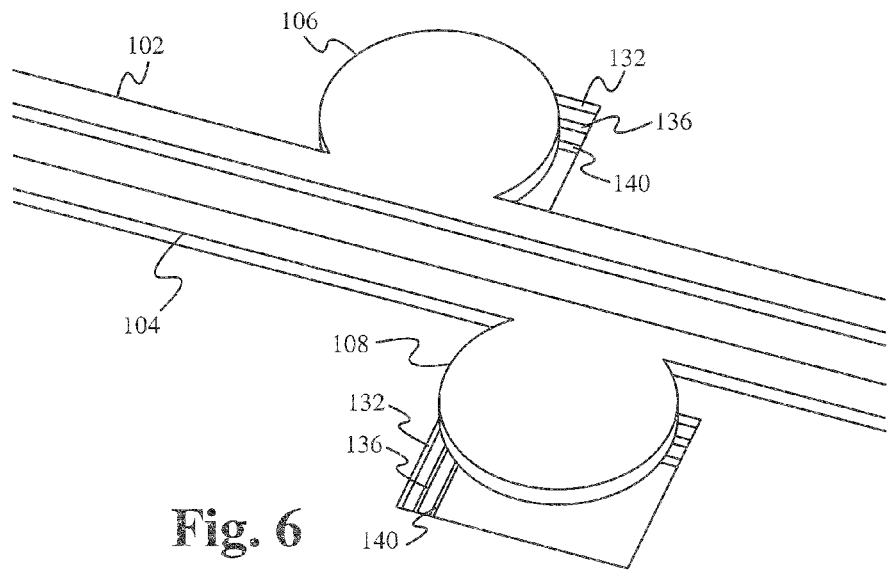
FIG. 6 illustrates an isometric and conceptualized view of the circuit board configuration of FIG. 5, showing only the conductive planes.

FIG. 6 illustrates an isometric and conceptualized view of the circuit board configuration of FIG. 5, showing only the conductive planes. The view in FIG. 6 shows the signal lines 102, 104, the test point pads 106, 108, and the conductive planes 132, 136, and 140 with the portions aligned with the test point pads 106 and 108 removed. The insulting layers 130, 134, and 138 are not shown in FIG. 6 to better illustrate the relationship between the test point pads 106, 108 and the removed portions of the conductive planes 132, 136, 140. In the exemplary configuration shown in FIG. 6, the shape of the test point pads 106, 108 is circular, and the shape of the removed portions is square. In alternative configurations, the test point pads can have shapes other than circles and the removed portions of the conductive layers can have shapes other than squares. In some embodiments, the shape of the test point pad is the same as the shape of the removed portion. In other embodiments, the shape and size of the removed portions is at least large enough so that no part of the conductive planes from which the portions are removed remains aligned within any part of the test point pad.

Referring to FIG. 5, the removed portions 131, 133, 135, 137, 139, and 141 are representations of portions of the conductive planes 132, 136, and 140 that have been removed. As such, the portions 131, 133, 135, 137, 139, 141 do not include conductive material. In some embodiments, the portions 131, 133, 135, 137, 139, 141 remain void, that is no material occupies the spaces represented by the portions 131, 133, 135, 137, 139, 141. In other embodiments, the portions 131, 133, 135, 137, 139, 141 are filled with insulating material.

The portions 131, 133, 135, 137, 139, 141 can be formed using any conventional fabrication process. In one embodiment, the circuit board is formed by laminating multiple different layer combinations together. For example, a substrate forms a dielectric layer, and a conductive layer is deposited on the dielectric layer, forming a layer combination, such as the dielectric layer 142 and the ground plane 140. The conductive layer can then be selectively etched to remove the desired portions, such as portions 139 and 141, that are to be aligned with corresponding test pad points. Additional layer combinations can be formed in a similar manner, such as a layer combination that includes the dielectric layer 138 and the power plane 136, a layer combination that includes the dielectric layer 134 and the ground plane 132, and a layer combination that includes the dielectric layer 130 and the top layer 128. Each of the layer combinations is then laminated together, or coupled together using any other conventional bonding or joining method, to form the circuit board. The gaps formed in the removed portions 131, 133, 135, 137, 139, 141 can be left void, or filled with an insulating material prior to laminating the layer combinations together.

In another embodiment, the circuit board is formed by fabricating each layer on top of each other, for example using conventional semiconductor fabrication processing methods. In this embodiment, the portions 131, 133, 135, 137, 139, 141 are filled with the insulating material used to form the overlaying layer. For example, the portions 139 and 141 are filled with the material used for the dielectric layer 138, the portions 135 and 137 are filled with the material used for the dielectric layer 134, and the portions 131 and 133 are filled with the material used for the dielectric layer 130.

In still another embodiment, the circuit board is formed by coupling multiple different layer combinations together, but without etching the portions 131, 133, 135, 137, 139, 141 prior to coupling. For example, layer combinations are coupled to form an intermediate circuit board structure including the layers 132, 134, 136, 138, 140, 142, 144, 146, 148, 150, 152, 154, 156, 158, and 160, but not the dielectric layer 130 and the top layer 128. Before adding the layer combination that includes the dielectric layer 130 and the top layer 128, the layers 132, 134, 136, 138, and 140 are selectively cut to remove blocks from all the layers 132, 134, 136, 138, 140 that are aligned, or underneath, the test point pads 106 and 108. These removed blocks include the portions 131, 133, 135, 137, 139, and 141. In this manner, a block is removed below each test point pad, where the block includes portions of the one or more conductive layers and one or more insulating layers nearest the test point pad. Once the blocks are removed, the top layer combination including the dielectric layer 130 and the top layer 128 is added to the intermediate circuit board structure with the blocks removed. The removed blocks can be left void or can be filled with insulating material prior to adding the top layer combination. If the blocks are left void, support is provided to the test point pads by the underlying dielectric layer 130.

It is understood that any combination of the above techniques can be used to form the circuit board with the removed conductive plane portions. It is also understood that the circuit board can be formed using any conventional circuit board fabrication technique that enables the select removal of portions of the conductive layer(s) nearest the test point pad.

Figure 7:
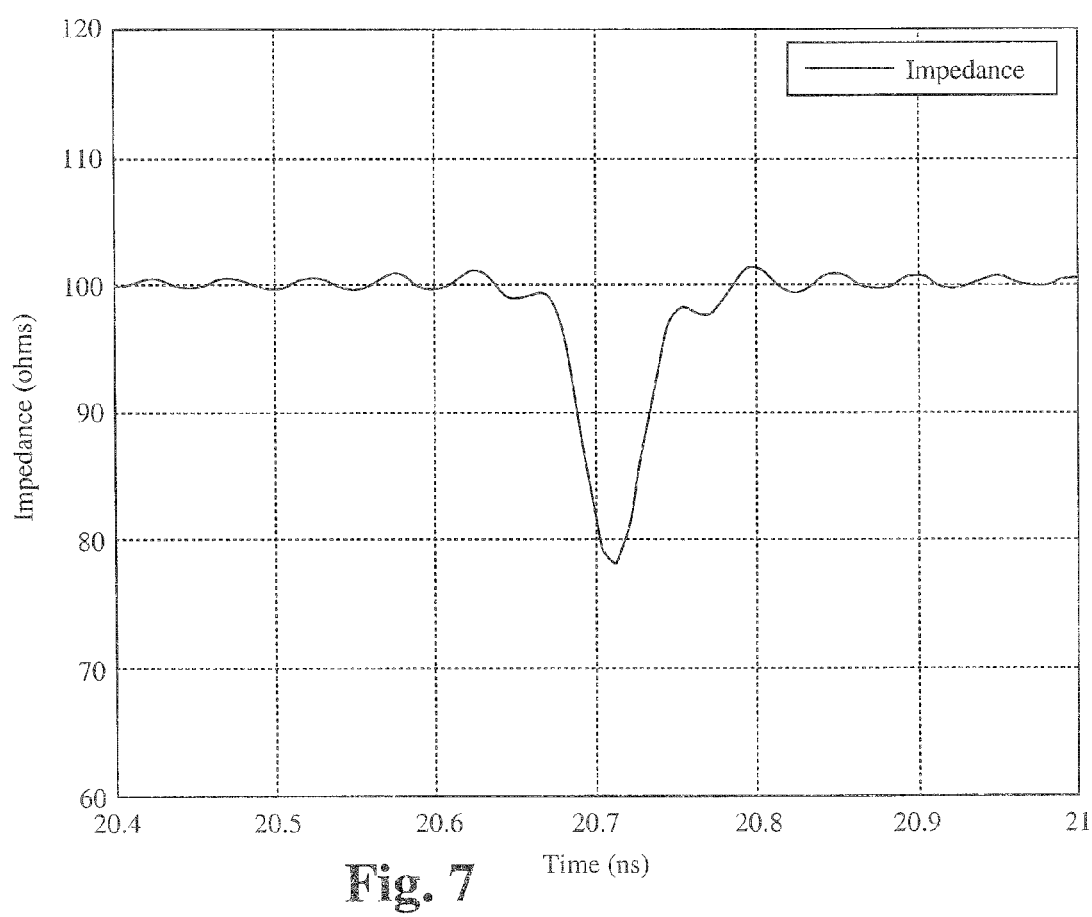
FIG. 7 illustrates an exemplary graph of impedance versus time for the signal line at the test point pad, where the test point pads are staggered, but the portions of the ground planes and power planes nearest the test point pads are not removed.
Figure 8:
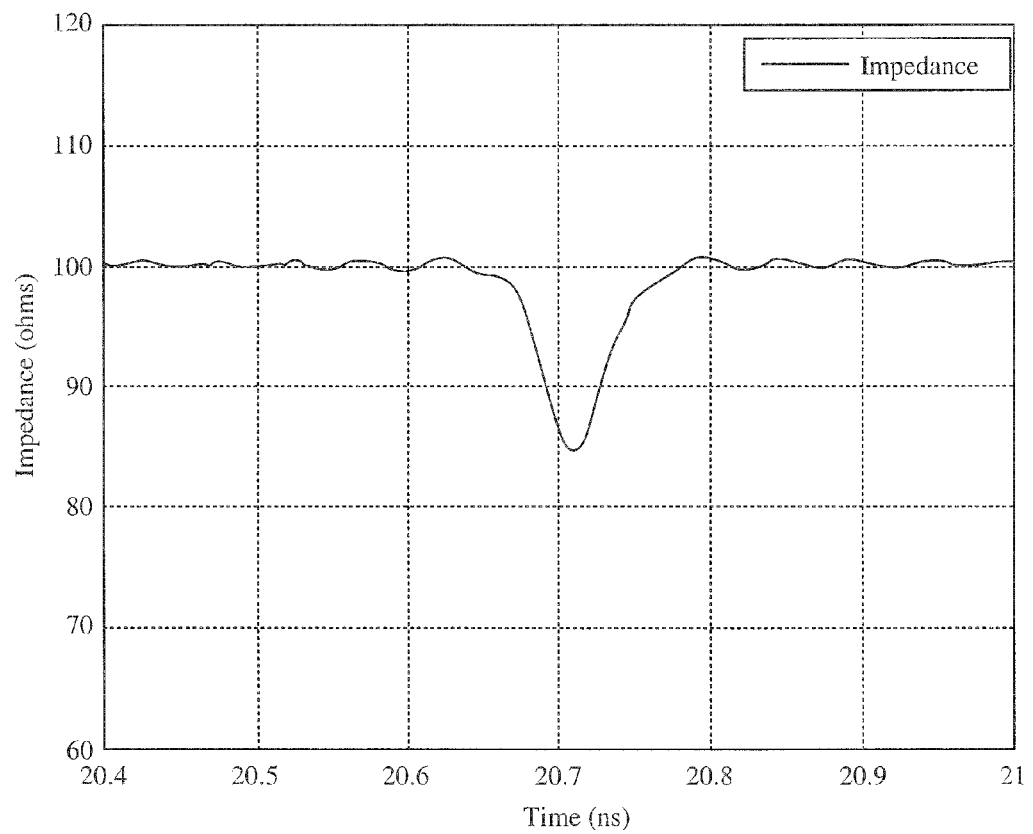
FIG. 8 illustrates the exemplary graph of impedance versus time for the signal lines at the test point pads, where the test point pads are staggered and the portions of the ground planes and power planes nearest the test point pads are removed.

In an exemplary high speed bus design, a desired design target for the signal line impedance is 100 ohms. The further the actual impedance is from 100 ohms, the more negatively performance is influenced. Addition of test point pads to a pair of differential signal lines pulls down the impedance from the desired target level. However, removing the portions of the ground plane(s) and power planes(s) nearest the test point pads pulls up the impedance closer to the desired target level. FIG. 7 illustrates an exemplary graph of impedance versus time for the signal line at the test point pad, where the test point pads are staggered, but the portions of the ground planes and power planes nearest the test point pads are not removed. In this exemplary application, the impedance is pulled down to approximately 84 ohms. FIG. 8 illustrates the exemplary graph of impedance versus time for the signal lines at the test point pads, where the test point pads are staggered and the portions of the ground planes 132 and 140 and power plane 136 are removed. In this exemplary application, the impedance is pulled up to approximately 79 ohms.

Figure 9:
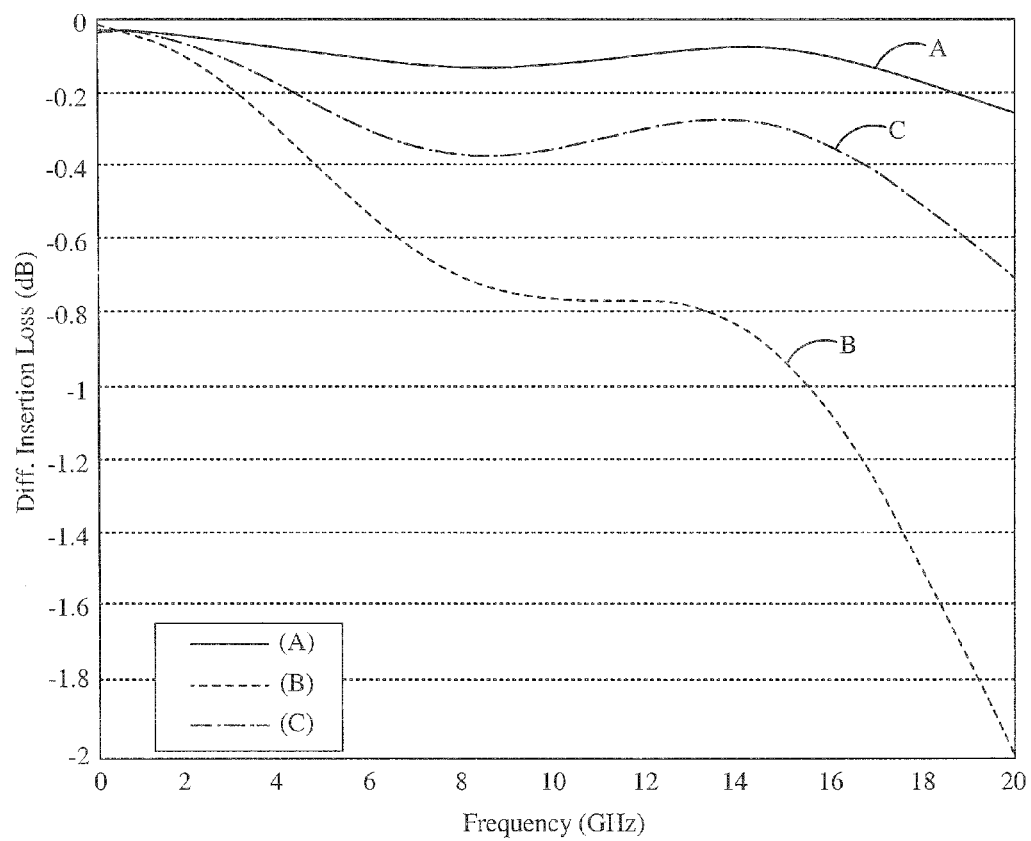
FIG. 9 illustrates exemplary graphs of differential insertion losses versus frequency for the pair of differential signal lines under various configurations.

FIG. 9 illustrates exemplary graphs of differential insertion losses versus frequency for the pair of differential signal lines under various configurations. Graph A shows the differential insertion losses versus frequency for the pair of differential signal lines without test point pads added. Graph B shows the differential insertion losses versus frequency for the pair of differential signal lines with test point pads added in a staggered configuration, but without the portions of the ground planes and the power plane removed. Graph C shows the differential insertion losses versus frequency for the pair of differential signal lines with test point pads added in a staggered configuration and with the portions of the ground planes and the power plane removed. As shown in FIG. 9, removal of the portions of the ground plane(s) and power plane(s) nearest the test point pads reduces the impact on insertion loss.

The test point design is described above in terms of adding test point pads to a top layer of a circuit board, and to removing portions of one or more ground planes and one or more power planes nearest the top layer. Alternatively, test point pads can be added to signal lines formed on a bottom layer, and portions of one or more ground planes and one or more power planes nearest the bottom layer can be removed. Still alternatively, test point pads can be added to both the top layer and to the bottom layer, and portions can be removed from one or more ground planes and one or more power planes nearest the top layer and from one or more ground planes and one or more power planes nearest the bottom layer.

Embodiments of the test point design are described above in terms of including both the staggered test point pad configuration and the removed portions of the ground plane(s) and/or power plane(s). In alternative embodiments, the staggered test point pad configuration and the removed portions configuration can be implemented as stand alone configurations.

Embodiments of the test point design are described above in terms of maintaining a minimum pitch between two adjacent test point pads. In alternative embodiments, the minimum pitch does not have to be maintained, and adjacent test point pads can be separated by a distance greater than the minimum pitch.

The test point design has been described in terms of specific embodiments incorporating details to facilitate the understanding of the principles of construction and operation of the test point design. The specific configurations shown and the methodologies described in relation to the various modules and the interconnections therebetween are for exemplary purposes only.

Such reference herein to specific embodiments and details thereof is not intended to limit the scope of the claims appended hereto. It will be apparent to those skilled in the art that modifications may be made in the embodiments chosen for illustration without departing from the spirit and scope of the test point design.

What is claimed is:

1. A test point design comprising:
   a. a circuit board comprising a plurality of layers including a power plane, a ground plane, and a dielectric plane between the power plane and the ground plane, the circuit board further comprises a differential pair of signal lines including a first signal line and a second signal line; and
   b. a pair of test point pads including a first test point pad connected to the first signal line and a second test point pad connected to second signal line, wherein a first portion of the power plane and a first portion of the ground plane below the first test point pad are removed, and a first portion of the dielectric plane below the first test point is not removed, and a second portion of the power plane and a second portion of the ground plane below the second test point pad are removed, and a second portion of the dielectric plane below the second test point is not removed, wherein the first portions of the power plane and the ground plane that are removed, and the first portion of the dielectric plane that is not removed are the portions of the power plane, dielectric plane and the ground plane that are aligned underneath the first test point pad, and the second portions of the power plane and the ground plane that are removed, and the second portion of the dielectric plane that is not removed are the portions of the power plane, dielectric plane and the ground plane that are aligned underneath the second test point pad, and wherein the removed portions remain void of any material.

2. The test point design of claim 1 wherein the first test point pad and the second test point pad are staggered relative to the pair of signal lines.

3. The test point design of claim 2 wherein the first test point pad and the second test point pad are staggered such that a first perpendicular line between a center of the first test point pad and the first signal line is not aligned with a second perpendicular line between a center of the second test point pad and the second signal line.

4. The test point design of claim 2 wherein the pitch between the center of the first test point pad and the center of the second test point pad is about 65 millimeters.

5. The test point design of claim 2 wherein the pair of test point pads are staggered by a pitch sufficient to enable a first probe to contact the first test point pad and a second probe to contact the second test point pad concurrently.

6. The test point design of claim 1 wherein the differential signal lines are positioned adjacent to each other.

7. The test point design of claim 1 wherein a segment of the first signal line connected to the first test pad, a segment of the second signal line connected to the second test pad, the first test pad, and the second test pad are all positioned in a same plane.

8. The test point design of claim 1 wherein the first test point pad and the second test point pad are both positioned on an outer layer of the circuit board.

9. The test point design of claim 1 wherein the circuit board comprises a plurality of power planes, and the first portion and the second portion from one or more power planes nearest the first test point pad and the second test point pad are removed.

10. The test point design of claim 1 wherein the circuit board comprises a plurality of ground planes, and the first portion and the second portion from one or more ground planes nearest the first test point pad and the second test point pad are removed.

11. The test point design of claim 1 wherein the circuit board comprises a plurality of power planes and a plurality of ground planes, and the first portion and the second portion from one or more power planes and one or more ground planes nearest the first test point pad and the second test point pad are removed.

* * * * *